United States Patent [19]

DuBois

[11] 4,402,134

[45] Sep. 6, 1983

[54] METHOD OF MAKING AN INTEGRATED DISPLAY DEVICE

[75] Inventor: Richard DuBois, North Caldwell, N.J.

[73] Assignee: Edison International, Inc., Rolling Meadows, Ill.

[21] Appl. No.: 203,239

[22] Filed: Nov. 3, 1980

Related U.S. Application Data

[60] Continuation of Ser. No. 23,076, Mar. 23, 1979, abandoned, which is a division of Ser. No. 850,919, Nov. 14, 1977, abandoned.

[51] Int. Cl.$^3$ .............................................. H05K 3/30

[52] U.S. Cl. ....................................... 29/832; 29/588; 29/589; 156/89; 174/52 FP

[58] Field of Search ............................ 357/73, 74, 80; 174/50.61, 52 FP; 313/220, 496; 29/588, 832, 589; 156/89, 280, 292, 308.2

[56] References Cited

U.S. PATENT DOCUMENTS

| | | | |
|---|---|---|---|
| 3,072,832 | 1/1963 | Kilby | 29/588 X |
| 3,341,649 | 9/1967 | James | 357/73 X |
| 3,650,778 | 3/1972 | Dumesnil et al. | 357/73 X |
| 3,900,935 | 8/1975 | Caras | 156/89 X |
| 4,047,072 | 9/1977 | Kishino et al. | 313/220 X |
| 4,084,114 | 4/1978 | Kuroda et al. | 313/496 |
| 4,132,920 | 1/1979 | Kobayakawa et al. | 313/220 X |

FOREIGN PATENT DOCUMENTS

| | | | |
|---|---|---|---|
| 49-16227 | 4/1974 | Japan | 29/588 |

*Primary Examiner*—Lowell A. Larson
*Assistant Examiner*—Carl J. Arbes
*Attorney, Agent, or Firm*—Jon Carl Gealow; James A. Gabala; Charles W. MacKinnon

[57] ABSTRACT

A high vacuum fluorescent display device contains solid state drive circuitry within a unitary evacuated container.

2 Claims, 5 Drawing Figures

METHOD OF MAKING AN INTEGRATED DISPLAY DEVICE

This is a continuation of application Ser. No. 23,076, filed Mar. 23, 1979, now abandoned, which was a division of application Ser. No. 850,919, filed Nov. 14, 1977, now abandoned.

BACKGROUND OF THE INVENTION

A growing class of display devices employs phosphor coated segmented anodes excited by low energy thermoelectrons emitted by a dull red filament controlled by a control grid either interposed therebetween or on the outside of the filament. These devices are enclosed in enclosures in which a hard vacuum is drawn. A transparent window in the enclosure enables viewing of the excited anode segments usually through the control grid. The segmented anodes may be in any configuration such as 7-segment numeric or multiple-segment alphabetic as illustrated in U.S. Pat. No. 3,986,760 or they may be in a sequentially illuminated linear indicator such as disclosed in U.S. patent application Ser. No. 732,330.

Vacuum fluorescent display devices are being widely chosen for display purposes because of their brightness, reliability, color and compatibility for drive by solid state descrete or integrated circuits. In the typical application, the value to be displayed is an analog or digital signal which must then be processed to yield one binary signal per anode segment to command each anode segment to be either illuminated or extinguished. More sophisticated systems can, in addition, incrementally control the brightness of the anode segments between full off and full on.

FIG. 1 shows the method used in the prior art to perform the simple function of driving a 7-segment numeric display 10 from a 4-line binary-coded-decimal input 12. An evacuated enclosure 14 of the display 10 is mounted on a suitable support such as a circuit board 16. An integrated circuit 18 in its evacuated enclosure 20 is also mounted on the circuit board 16. One signal line 22 per segment, a total of 7 lines in the illustrated example, is connected between the evacuated enclosure 20 and the evacuated enclosure 14 to connect the 7 binary signals between them. Thus, exclusive of DC power inputs, the integrated circuit evacuated enclosure 20 has 11 hermetically sealed leads 24 piercing it and the display evacuated enclosure 14 has 7 hermetically sealed leads 24 piercing it. Furthermore, the leads 24 are connected to the signal lines 22 by interconnections 26 at each of the two ends of each signal line 22. Thus there are 14 interconnections 26 for the 7 signal lines 22. In the electronics industry, faulty interconnections 22 account for a large part of both assembly labor and device failures. An even more exaggerated example of interconnect requirements is to be found in the linear scale indicator of the referenced U.S. patent application. A 40-segment linear scale indicator as illustrated at 28 in FIG. 2 require 40 signal lines 22, 80 hermetic scals and 80 interconnections to control the 40 segments from a driver integrated circuit 30. In a typical application, only a single analog input signal line 32 is required into the integrated circuit 30. The integrated circuit 30 generates a contiguous set of binary ones on the signal lines 22 to the linear scale indicator 28 in proportion to the amplitude of the analog signal on the signal line 32.

SUMMARY OF THE INVENTION

The applicant has discovered that many of the mechanical, chemical and sealing operations incident to manufacturing a vacuum fluorescent display and an integrated circuit are the same. For example, both devices require cleaning, metallizing, application of photoresist, etching and removal of photoresist. In addition, the working environment of both devices is preferably a hard vacuum. The bonding of the inegrated circuit to the substrate is performed using a low temperature glass preform which fuses at a low temperature of approximately 525° C. This temperature is low enough to have negligible effect on the integrated circuit. Furthermore, the cover of the enclosure is bonded to the substrate at the same temperature. Consequently, the applicant contemplates performing the electrical interconnections between electrical leads formed on the substrate and integrated circuit, then placing the cover in place and bonding the integrated circuit to the substrate in the same heating operation used to seal the perimeter of the cover to the substrate.

The applicant discloses a device in which the integrated circuit and vacuum fluorescent display are both fabricated on a single substrate with direct interconnections between devices. Both devices are sealed within a single evacuated envelope. Thus, 14 of the hermetic seals for leads 24 shown in FIG. 1 and the 14 interconnects 26 are eliminated. In FIG. 2, 80 leads and interconnects are eliminated leaving only the analog signal line 32 piercing the vacuum enclosure. In all cases, certain dc connections, such as filament voltages must still be supplied through the vacuum envelope.

In one application contemplated by the applicant, a complete digital clock, including a plurality of numeric display devices and the timing and control electronics are all fabricated on a single substrate, interconnected and enclosed in a single evacuated enclosure. Gettering may be employed to improve the vacuum.

The very great reduction in assembly labor as well as the improvement in reliability, stemming from the sharply reduced number of hermetic seals and interconnects, gives the present invention significantly improved practicability.

DETAILED DESCRIPTION OF THE PREFERRED EMBODIMENT

Figure 1:
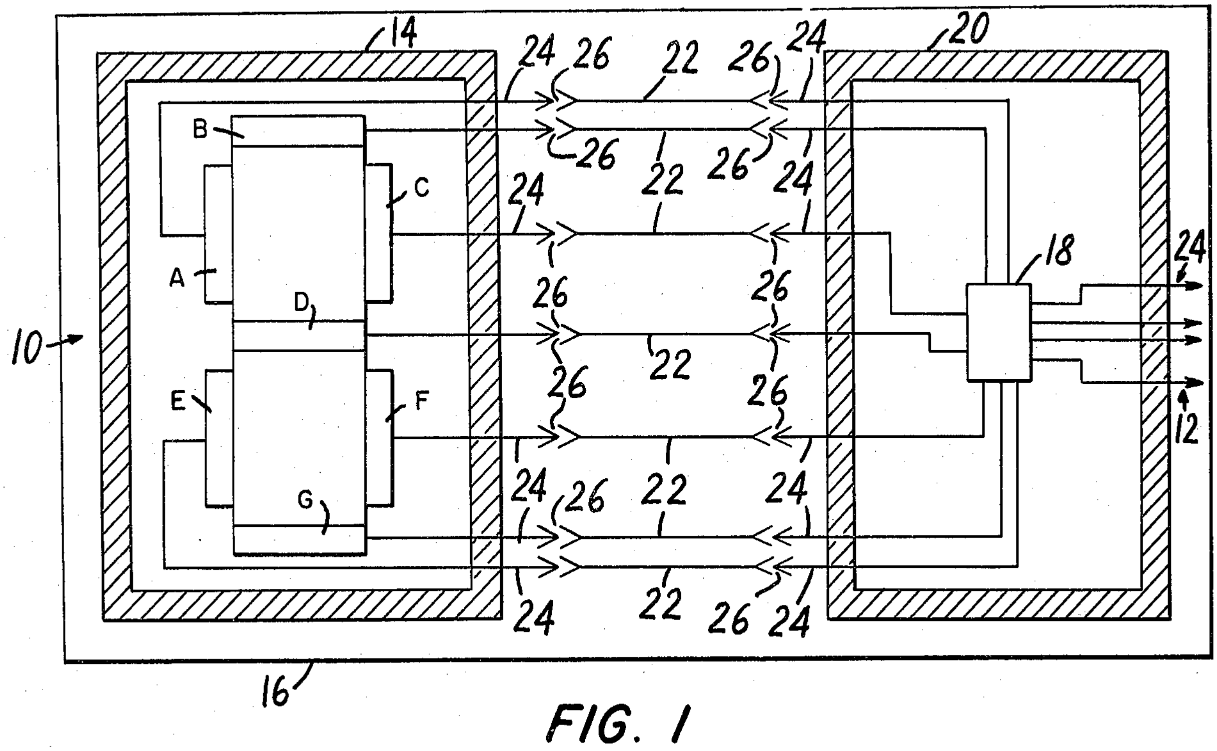
FIG. 1 (PRIOR ART)
FIG. 1 shows one example of the prior art employing a 7-segment alphanumeric display controlled by an integrated circuit.
Figure 3:
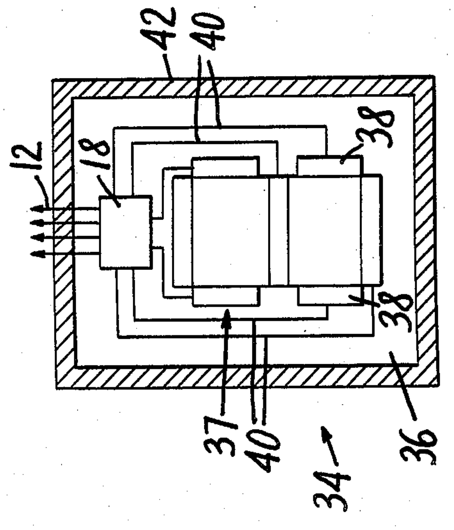
FIG. 3 shows one embodiment of the present invention.

Referring to FIG. 3, there is shown generally at 34 an integrated display according to the present invention. A substrate 36, suitably of glass or ceramic has a display device 37 applied thereto consisting of of a conductive pattern of segmented anodes 38 and integral interconnect lines 40 formed by conventional methods well known in the art. At least part of the anode 38 are covered by electron-excitable phosphor material. An integrated circuit 18 is affixed to the same substrate 36 containing the display device 37 and interconnect lines 40 within the same evacuated enclosure 42. The evacuated enclosure is formed by a concave cover plate being placed over the substrate 36 and sealed thereto about their abutting perimeters. In this way, only internal connections between the display device 37 and the integrated circuit 18 are required. As is readily evident, the device in FIG. 3 eliminated 14 interconnects and 14 hermetic seals as compared to the prior art device shown in FIG. 1.

Figure 2:
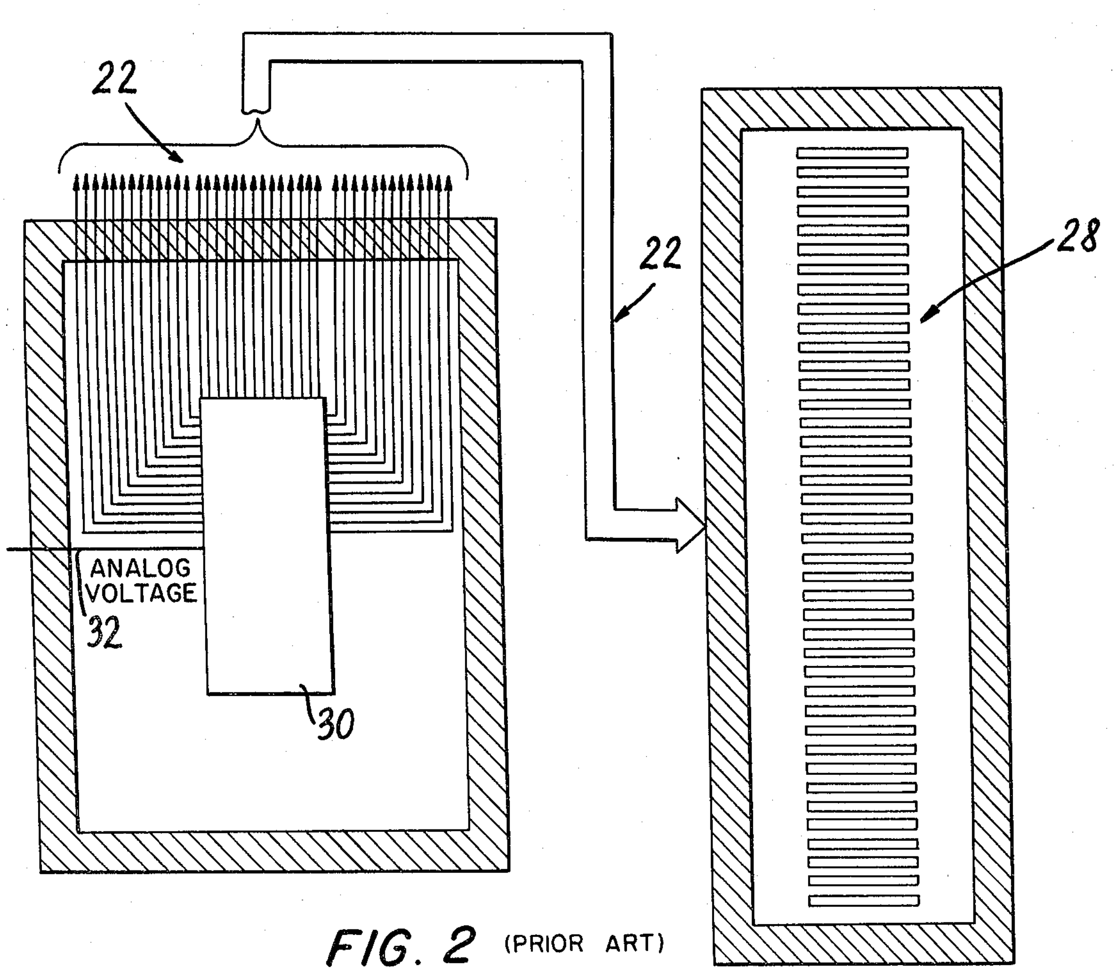
FIG. 2 (PRIOR ART)
FIG. 2 shows another example of the prior art employing a linear scale indicator.

Even more dramatic reductions in interconnects and hermetic seals occur when a prior art device of the type shown in FIG. 2 is integrated into a single evacuated enclosure. Eighty of 81 hermetic seals and 80 interconnects are eliminated in the 40-segment device and replaced by high-reliability machine-made interconnect lines which are sealed and protected within the single evacuated enclosure.

Figure 4:
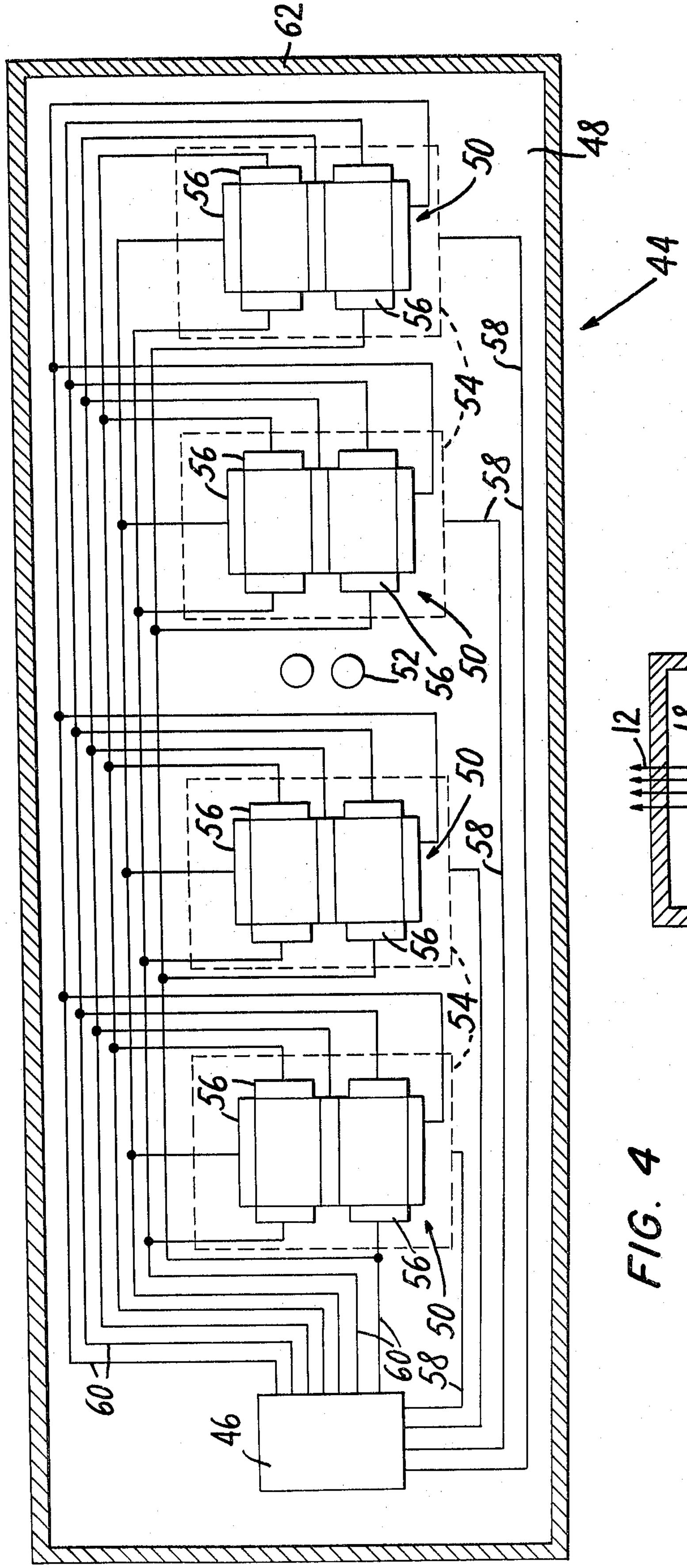
FIG. 4 shows another embodiment of the present invention.

Certain types of devices made according to the present invention require no signal inputs or outputs except for power and alignment signals. A complete digital clock is shown at 44 in FIG. 4. A digital clock integrated circuit 46 is affixed to the same substrate 48 as the four-digit display elements 50 and the hours/minutes delimiter 52. According to the operation of vacuum fluorescent display devices disclosed in the references, a control grid 54 over each display element 50 determines whether it is illuminated or extinguished. Each control grid 54 is connected to the digital clock integrated circuit 46 by a control line 58 at least partly integrally formed on the substrate 48 during the preparation of the display elements 50. The corresponding anodes 56 from each display element 50 are connected in parallel to outputs of the digital clock integrated circuit 46 by signal lines 60 at least partly integrally formed on the substrate 48 during the preparation of the display elements 50. It will be evident to one skilled in the art, that the control lines 58 and signal lines 60 may be on the front or rear face of the substrate or they may be sandwiched between one or more layers of insulating material. Furthermore, some parts of the control lines 58 and signal lines 60 may be on one surface and other parts on other surfaces. Interconnections between display elements 50, integrated circuit 46 and parts of the control and signal lines 58, 60 may be direct or through holes in the insulating layers or by other means known or to become known in the art. The display elements 50, the integrated circuit 46 and at least part of the control and signal lines 58, 60 are enclosed within a single evacuated enclosure 62.

The digital clock 44 illuminates each of the display elements 50 in turn at a high rate to create the visual impression that all display elements 50 are continuously illuminated with their selected numerals. For example, the control lines 58 may enable the illumination of one display element 50 at a time at the rate of 400 per second. Thus each of the 4 display elements 50 is illuminated 100 times per second. At the time a particular display element 50 is enabled by its control line 58, all signal lines 60 assume the digital code required to display the decimal digit required for that position. As the next display element 50 is enabled by its control line 58, the digital code on all signal lines 60 changes to display the decimal digit required for that position.

In all devices discussed, dc power input leads are required through hermetic seals. These have been omitted for simplicity.

Figure 5:
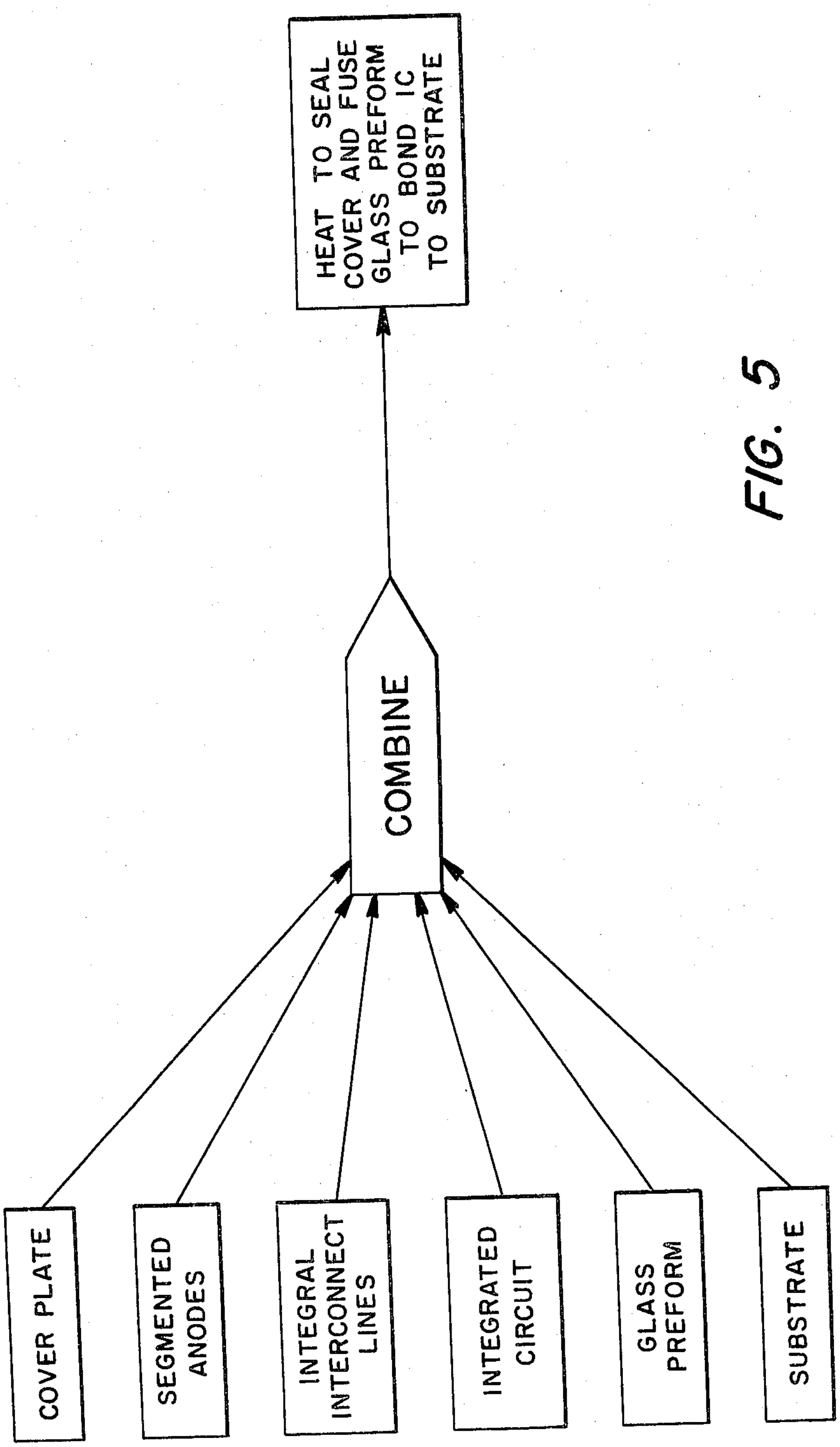
FIG. 5 is a flow chart of the method according to the invention of bonding an integrated circuit to the substrate of a vacuum fluorescent device.

FIG. 5 is a flow chart of the method according to the invention. A substrate, glass preform, integrated circuit, integral interconnect lines, segmented anodes, and cover plate are combined, the glass preform being utilized for performing the bonding of the integrated circuit to the substrate. The combination is subsequently heated to seal the cover to the substrate and to fuse the glass preform for bonding the integrated circuit to the substrate in the same heating operation.

It will be understood that the claims are intended to cover all changes and modifications of the preferred embodiments of the invention, herein chosen for the purpose of illustration which do not constitute departures from the spirit and scope of the invention.

What is claimed is:

1. In a method of producing an integrated display device comprising a substrate and a cover bonded thereto which forms a hermetically sealed enclosure having an integrated circuit mounted therein, which method includes the steps of mounting said integrated circuit on said substrate, forming a plurality of anodes on said substrate, forming integral electric leads on said subsrate, said electric leads interconnecting at least said anodes and said integrated circuit, said anodes having at least a part thereof coated with a phosphor, and heating said substrate and cover for heat bonding said cover to said substrate, the improvement comprising the steps of providing a low temperature glass preform on said substrate for affixing said integrated circuit to said substrate wherein said low-temperature glass preform fuses when said cover and substrate are heated for heat bonding said cover and said integrated circuit to said substrate simultaneously during the same heating operation.

2. The method of claim 1 wherein the substrate and cover are heated to 525° C.

* * * * *